(12) United States Patent
Leng

(10) Patent No.: US 10,566,532 B2
(45) Date of Patent: Feb. 18, 2020

(54) DISPLAY PANEL, DISPLAY SUBSTRATE, AND INKJET PRINTING METHOD APPLICABLE TO THE DISPLAY SUBSTRATE

(71) Applicant: SHANGHAI TIANMA MICRO-ELECTRONICS CO., LTD., Shanghai (CN)

(72) Inventor: Chuanli Leng, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 67 days.

(21) Appl. No.: 15/889,212

(22) Filed: Feb. 6, 2018

(65) Prior Publication Data

US 2018/0159038 A1   Jun. 7, 2018

(30) Foreign Application Priority Data

Sep. 22, 2017   (CN) .......................... 2017 1 0867408

(51) Int. Cl.
*H01L 51/00* (2006.01)
*B41J 11/00* (2006.01)
(Continued)

(52) U.S. Cl.
CPC ............ *H01L 51/0005* (2013.01); *B41J 2/04* (2013.01); *B41J 3/407* (2013.01); *B41J 11/0015* (2013.01);
(Continued)

(58) Field of Classification Search
CPC .......... H01L 51/0005; B41J 2/04; B41J 3/407
See application file for complete search history.

(56) References Cited

U.S. PATENT DOCUMENTS

| | | | |
|---|---|---|---|
| 2009/0220679 A1 | 9/2009 | Kumagai et al. | |
| 2010/0128160 A1* | 5/2010 | Maru | G09G 3/3233 348/333.01 |

(Continued)

FOREIGN PATENT DOCUMENTS

| | | |
|---|---|---|
| CN | 102308404 A | 1/2012 |
| JP | 2003059660 A | 2/2003 |

*Primary Examiner* — Thao X Le
*Assistant Examiner* — Xia L Cross
(74) *Attorney, Agent, or Firm* — Kilpatrick Townsend & Stockton, LLP

(57) ABSTRACT

Disclosed are a display panel, a display substrate, and an inkjet printing method. The display panel includes an underlying substrate, anode layers of a plurality of organic light-emitting pixels arranged in a matrix over the underlying substrate; and reference lines and first switch transistors, arranged over the underlying substrate, each of the respective reference lines corresponds to each of the respective anode layers, and each of the first switch transistors corresponds to each of the anode layers; where each of the anode layers is connected with the corresponding reference line through the corresponding first switch transistor; and anode layers of the pixels in a same color share a same reference line, and anode layers of the pixels in different colors correspond to different reference lines; and the reference lines are configured to provide the anode layers with electric charges while organic light-emitting functional layers are being fabricated on the anode layers.

17 Claims, 11 Drawing Sheets

(51) Int. Cl.
*B41J 2/04* (2006.01)
*B41J 3/407* (2006.01)
*H01L 51/52* (2006.01)
*H01L 27/32* (2006.01)
*H01L 51/56* (2006.01)

(52) U.S. Cl.
CPC ...... *H01L 51/5206* (2013.01); *H01L 27/3244* (2013.01); *H01L 51/56* (2013.01); *H01L 2227/323* (2013.01)

(56) References Cited

U.S. PATENT DOCUMENTS

2014/0353671 A1* 12/2014 Choi ................ H01L 27/3276
257/72
2016/0315261 A1   10/2016 Cho

* cited by examiner

DISPLAY PANEL, DISPLAY SUBSTRATE, AND INKJET PRINTING METHOD APPLICABLE TO THE DISPLAY SUBSTRATE

CROSS REFERENCE TO RELATED APPLICATION

This application claims priority to Chinese Patent Application No. 201710867408.2, filed with the Chinese Patent Office on Sep. 22, 2017. The entire disclosure of the above application is incorporated herein by reference.

FIELD

The present disclosure relates to the field of display technologies, and particularly to a display panel, a display substrate, and an inkjet printing method applicable to the display substrate.

BACKGROUND

An Organic Light-Emitting Diode (OLED) display panel is a display component encapsulated using an organic material, and has low operating voltage, a high response speed, high light-emission efficiency, a wide angle of view, a wide range of operating temperature, and other advantages, so the display component can be designed with a low weight, a small thickness, low power consumption, and a curved surface.

An organic light-emitting functional layer in an organic electroluminescent device is typically fabricated in the related art through inkjet printing. Organic ink drops are jetted from a nozzle onto an anode layer of an intended pixel, but the organic ink drops being jetted tend to be offset in position, so that they are jetted onto an anode layer of an unintended pixel, thus resulting in a risk of color crosstalk.

SUMMARY

Embodiments of the disclosure provide a display panel, a display substrate, and an inkjet printing method applicable to the display substrate so as to address the problem in the related art of color crosstalk in a displayed image due to a positional offset of organic ink drops.

An embodiment of the disclosure provides a display panel. The display panel includes an underlying substrate. Over the underlying substrate, there are anode layers of a plurality of organic light-emitting pixels arranged in a matrix, reference lines each of which corresponds to each of the anode layers, and first switch transistors each of which corresponds to each of the anode layers. Each of the anode layers is connected with its corresponding reference line through its corresponding first switch transistor; and the anode layers of the pixels in the same color share the same reference line, and the anode layers of the pixels in different colors correspond to different reference lines; and the reference lines are configured to provide the anode layers with electric charges while organic light-emitting functional layers are being fabricated on the anode layers.

An embodiment of the disclosure further provides a display substrate. The display substrate includes a mother substrate including a plurality of display panel areas arranged in a matrix, where a display panel is arranged in each of the display panel area. The display panel includes an underlying substrate. Over the underlying substrate, there are anode layers of a plurality of organic light-emitting pixels arranged in a matrix, reference lines each of which corresponds to each of the anode layers, and first switch transistors each of which corresponds to each of the anode layers Each of the anode layers is connected with its corresponding reference line through its corresponding first switch transistor; and the anode layers of the pixels in the same color share the same reference line, and the anode layers of the pixels in different colors correspond to different reference lines; and the reference lines are configured to provide the anode layers with electric charges while organic light-emitting functional layers are being fabricated on the anode layers.

An embodiment of the disclosure further provides an inkjet printing method applicable to the display substrate according to the embodiment above of the disclosure. The method includes jetting and applying ink drops carrying electric charges onto anode layers of pixels in a preset color, and providing electric charges opposite in polarity to the electric charges carried in the ink drops to reference lines corresponding to the anode layers of the pixels in the preset color. The method further includes providing electric charges identical in polarity to the electric charges carried in the ink drops to reference lines corresponding to anode layers of pixels in the other colors than the preset pixel color. The preset pixel color is one of the pixel colors in the display panel areas.

DETAILED DESCRIPTION OF THE EMBODIMENTS

Figure 1:
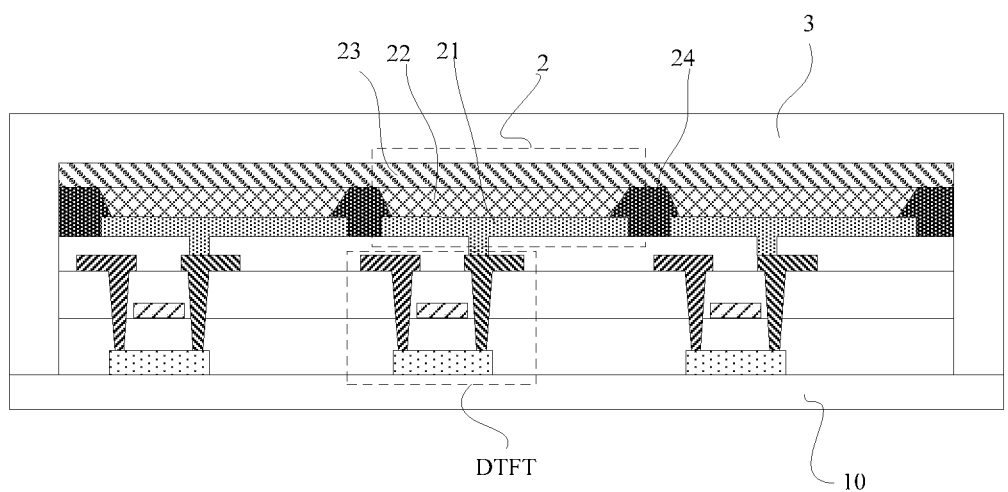
FIG. 1 shows a schematic structural diagram of an OLED display panel.

As illustrated in FIG. 1, an OLED display panel includes an underlying substrate 10, and organic light-emitting pixels 2 arranged in a matrix, and an encapsulation layer 3, located over the underlying substrate 10. Each organic light-emitting pixel 2 includes an anode layer 21, an organic light-emitting functional layer 22, and a cathode layer 23, arranged in a stack. A pixel definition layer 24 is further arranged on the anode layer 21 to define the organic light-emitting functional layer. Pixel circuits corresponding to the organic light-emitting pixels 2 are further arranged over the underlying substrate 10, where each pixel circuit includes a driving transistor connected with the anode layer 21, and at least one switch transistor, although only the driving transistor DTFT connected with the anode layer 21 is illustrated in FIG. 1. The organic light-emitting functional layer can be formed using low molecular weight (LMW) organic ilk material or high molecular weight (HMW) organic material. The organic light-emitting functional layer 22 includes an organic emitting layer, and can further include at least one of a Hole Injection Layer (HIL), a Hole Transport Layer (HTL), an Electron Transport Layer (ETL), and an Electron Injection layer (EIL). However the organic light-emitting functional layer 22 can further include various other functional layers in addition to the organic emitting layer.

The OLEO display panel is typically manufactured by fabricating the organic light-emitting functional layer through inkjet printing, where there are different materials of the organic emitting layers corresponding to the organic light-emitting pixels in different colors, and the other functional layers than the organic emitting layer in the organic light-emitting functional layer are common layers. However organic ink drops being jetted and applied to the organic emitting layer tend to be offset in position, so that they are jetted onto an anode layer of an unintended pixel, for example, organic ink drops for a red pixel are jetted onto an anode layer of a green pixel, thus resulting in a risk of color crosstalk.

The shapes and sizes of respective components in the drawings are not intended to reflect any real proportion, but merely intended to illustrate the disclosure of the disclosure.

Figure 2:
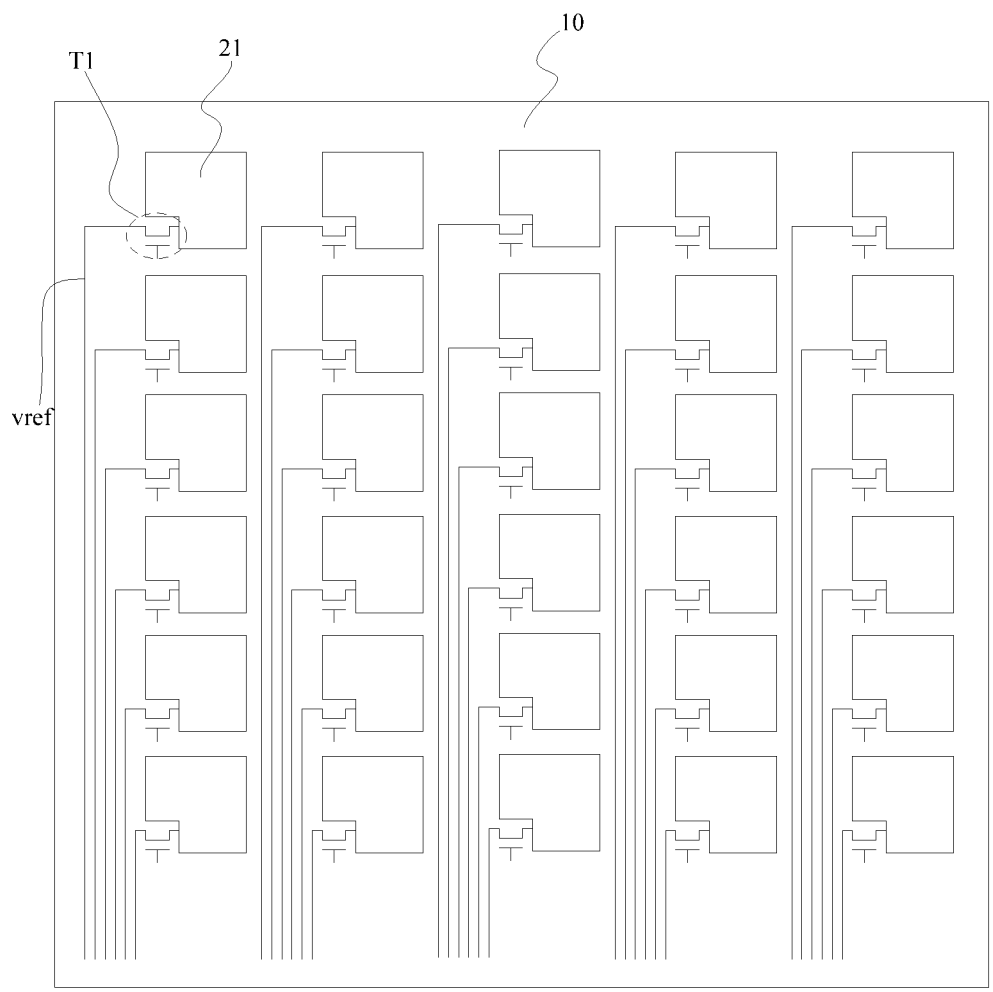
FIG. 2 shows a schematic structural diagram of a display panel according to an embodiment of the disclosure in a top view.

As illustrated in FIG. 2, a display panel according to an embodiment of the disclosure includes an underlying substrate 10, and anode layers 21 of a plurality of organic light-emitting pixels over the underlying substrate 10, where the anode layers 21 are arranged in matrix.

Further, there are reference lines vref corresponding to the respective anode layers 21, and first switch transistors T1 arranged over the underlying substrate 21. The first switch transistors T1 each corresponds to each of the anode layers 21.

The respective anode layers 21 each is connected with the corresponding reference line vref through the first switch transistors T1 corresponding thereto.

The anode layers 21 of the pixels in the same color share the same reference line vref, and the anode layers 21 of the pixels in different colors correspond to different reference lines vref. The reference lines vref are configured to provide the anode layers 21 with electric charges while organic light-emitting functional layers are being fabricated on the anode layers 21.

In one or more embodiment, in the display panel according to the embodiment of the disclosure, ink drops carrying electric charges are typically jetted and applied onto the anode layers through inkjet printing to fabricate the organic light-emitting functional layers on the anode layers.

In the display panel according to the embodiment of the disclosure, the respective reference lines correspond to the respective anode layers, and the first switch transistors each of which corresponds to each of the respective anode layers are further arranged over the ilk underlying substrate, where each of the respective anode layers is connected with it corresponding reference line through its corresponding first switch transistor; and the anodes of the pixels in the same color share the same reference line, and the anodes of the pixels in different colors correspond to different reference lines, so that when ink drops are jetted and applied onto the anode layers through inkjet printing, electric charges from the reference lines are applied to the anode layers through the first switch transistor to make the electric charges on the anode layers opposite in polarity to electric charges carried in the ink drops from a corresponding nozzle, and thus the ink drops from the nozzle are attracted onto the anode layers of the pixels for which they are intended for, as per the principle that unlike charges attract so as to address the problem in the related art of color crosstalk in a displayed image due to a positional offset of ink drops.

In the display panel according to the embodiment of the disclosure, the gates of the first switch transistors are floating, and when the organic light-emitting functional layers are fabricated on the anode layers, there is leakage current in the first switch transistors, so electric charges on the reference lines are provided to the anode layers by the leakage current in the first switch transistors. When the display panel is displaying, there are no signals on the reference lines, so there is no leakage current flowing from the first switch transistors to the anode layers, that is, the first switch transistors are switched off, so that short-circuiting can be avoided from occurring between the anode layers. In some embodiments the gate of each first switch transistor can be connected with a control line, and when the organic light-emitting functional layer is fabricated on the anode layer, the first switch transistor is controlled by a signal of the control line to be switched on.

In one embodiment, in the display panel according to the embodiment of the disclosure, there are at least three colors for the pixels in the display panel, e.g., the three primary colors of red, green, and blue. In some embodiments, other colors such as yellow, white, etc., can be set as needed, although the embodiment of the disclosure will not be limited thereto.

Taking the red, green, and blue pixels as an example, in the display panel according to the embodiment of the disclosure, when an organic entitling layer is formed on an anode layer of a red pixel, for example, there are positive electric charges carried in ink drops, and negative electric charges are provided to the anode layer of the red pixel by a reference line corresponding to the anode layer of the red pixel, so that the ink drops are attracted onto the anode layer of the red pixel as per the principle that unlike charges attract. Alike positive electric charges are provided to an anode layer of the green pixel by a reference line corresponding to the anode layer of a green pixel, and positive electric charges are provided to an anode layer of the blue pixel by a reference line corresponding to the anode layer of a blue pixel, so both the anode layer of the green pixel and the anode layer of the blue pixel repel the ink drops carrying the positive charges, as per the principle that like charges repel. When a Hole Injection Layer (HIL) is formed on the anode layer, since the HIL is a common layer, it may need to be formed on each anode layer, for example, there are positive electric charges carried in ink drops, and negative electric charges are provided to the anode layer of the red pixel by the reference line corresponding to the anode layer of the red pixel, negative electric charges are provided to the anode layer of the green pixel by the reference line corresponding to the anode layer of the green pixel, and negative electric charges are provided to the anode layer of the blue pixel by the reference line corresponding to the anode layer of the blue pixel, so that the ink drops are attracted onto the respective anode layers as per the principle that unlike charges attract.

Figure 3:
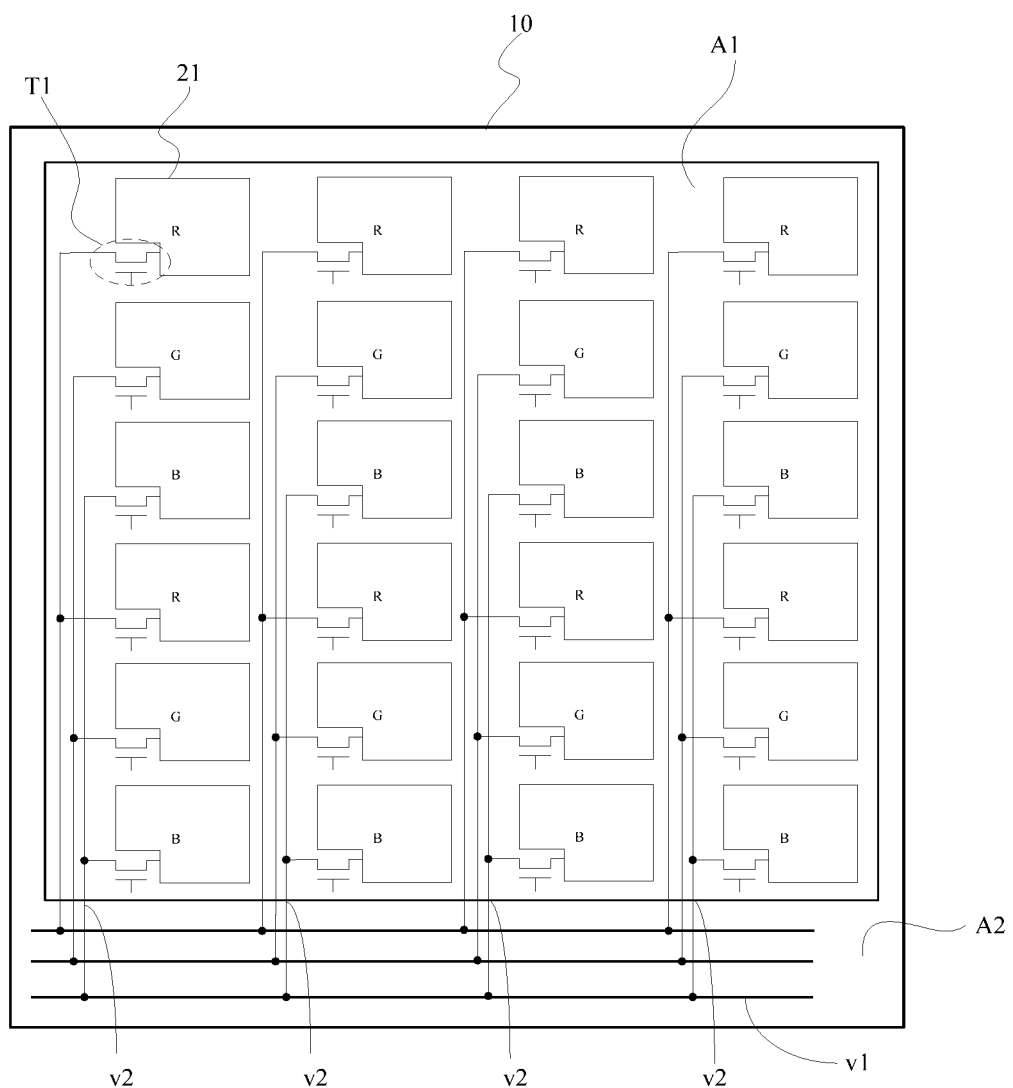
FIG. 3 shows a schematic structural diagram of a display panel according to another embodiment of the disclosure in a top view.

In one embodiment, in the display panel according to the embodiment of the disclosure, as illustrated in FIG. 3, the reference lines vref corresponding to the anode layers 21 of the pixels in any one of the colors include a bus v1 extending in a first direction, and a plurality of branches v2, connected with the bus v1, extending in a second direction, where the first direction is perpendicular to the second direction;

each of the branches v2 corresponds to a column of the anode layers 21 of the pixels in the same color, extending in the second direction; and each of the anode layers 21 is connected with the corresponding branch v2 through the corresponding first switch transistor T1.

It shall be note that FIG. 3 illustrates the pixels in three colors of Red (R), Green (G), and Blue (B) by way of an example.

In the display panel according to the embodiment of the disclosure, the first direction is the column direction, and the second direction is the row direction; or the first direction is the row direction, and the second direction is the column direction; although the embodiment of the disclosure will not be limited thereto.

In the display panel according to the embodiment of the disclosure, since the anode layers of the pixels in the same color among the anode layers arranged in the second direction can share the same branch, the amount of wiring on the display panel can be greatly reduced. Moreover all the branches corresponding to the pixels in the same colors receive electric charges over the buses, so that this can be done simply by applying voltage to the buses.

In one embodiment, in the display panel according to the embodiment of the disclosure, as illustrated in FIG. 3, the underlying substrate 10 includes a display area A1, and a non-display area A2 surrounding the display area A1; and all of the anode layers 21, the first switch transistors T1, and the branches v2 are located in the display area A1, and the buses v1 are located in the non-display area A2.

In the display panel according to the embodiment of the disclosure, the buses are located in the non-display area, so that the amount of wiring in the display area can be reduced, and it is relatively simple to provide electric charges to the buses. In one embodiment, elements for displaying are arranged in the display area, the buses can be arranged in the non-display area to thereby avoid the devices in the display area from being affected by the fabricated buses.

In one embodiment, in the display panel according to the embodiment of the disclosure, the buses can alternatively be located in the display area, although the embodiment of the disclosure will not be limited thereto.

In one embodiment, in the display panel according to the embodiment of the disclosure, as illustrated in FIG. 3, the respective buses v1 are located on the same side of the display area A1.

Figure 4:
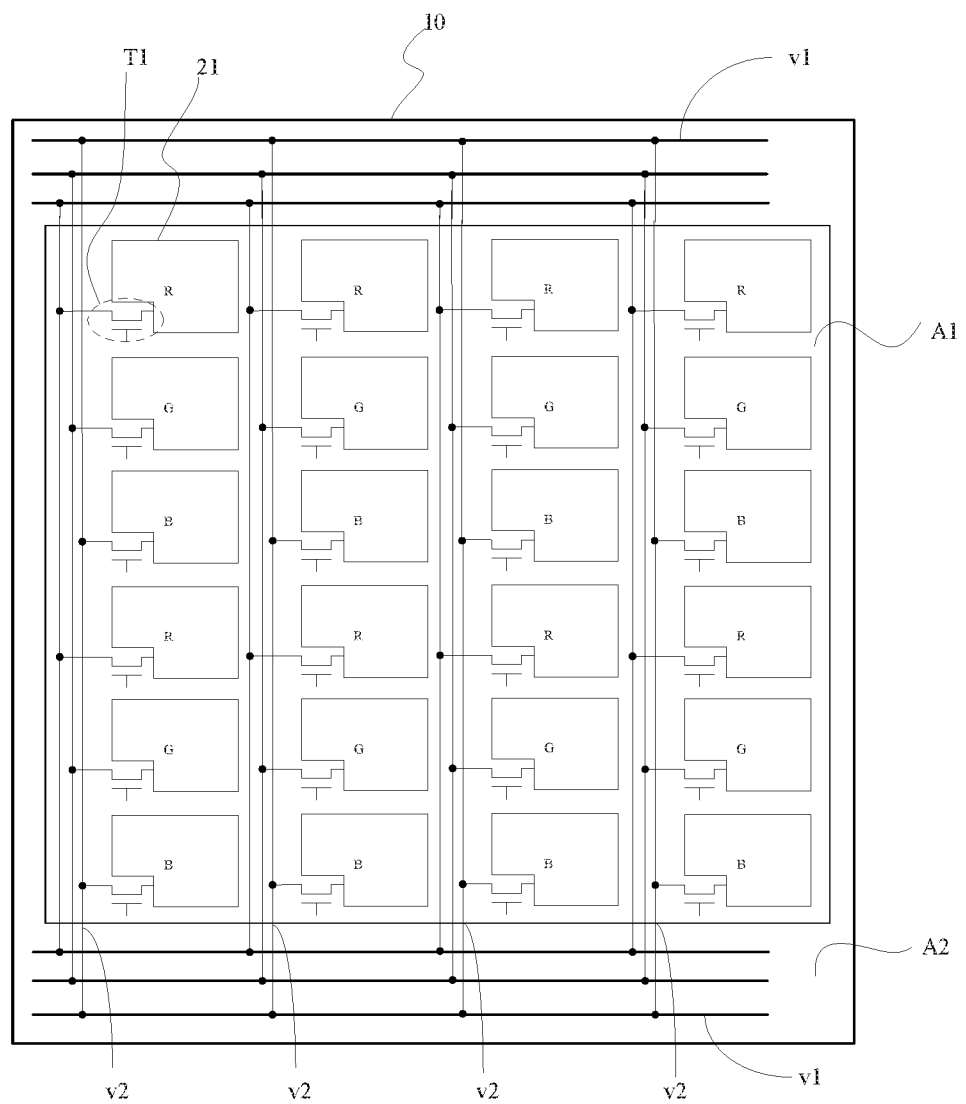
FIG. 4 shows a schematic structural diagram of a display panel according to another embodiment of the disclosure in a top view.

In one embodiment, in the display panel according to the embodiment of the disclosure, as illustrated in FIG. 4, the reference lines vref corresponding to the anode layers 21 of the pixels in any one of the colors include two buses v1 located respectively on two sides of the display area A1. Electric charges are provided by the two buses v1 to the anode layers 21 of the pixels in the same color, so that even if one of the buses fails, then the fabrication of the organic light-emitting functional layers will not be affected.

Figure 5:
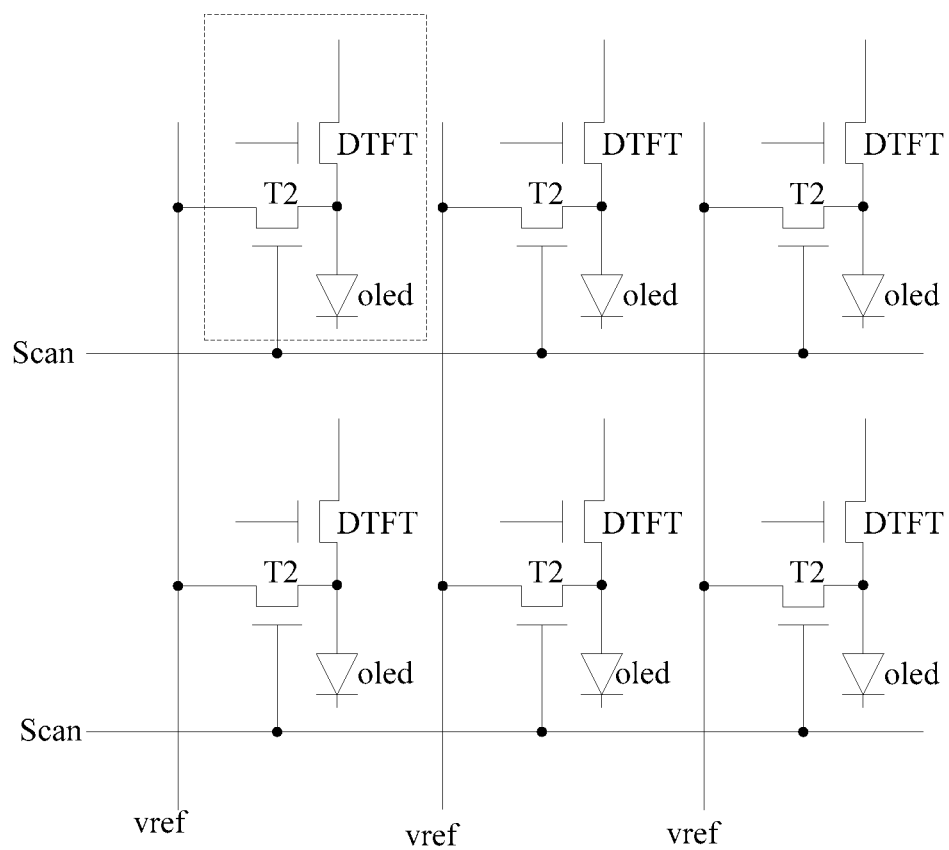
FIG. 5 shows a schematic diagram illustrating circuit connections of anode reset transistors in a display panel according to an embodiment of the disclosure.
Figure 6:
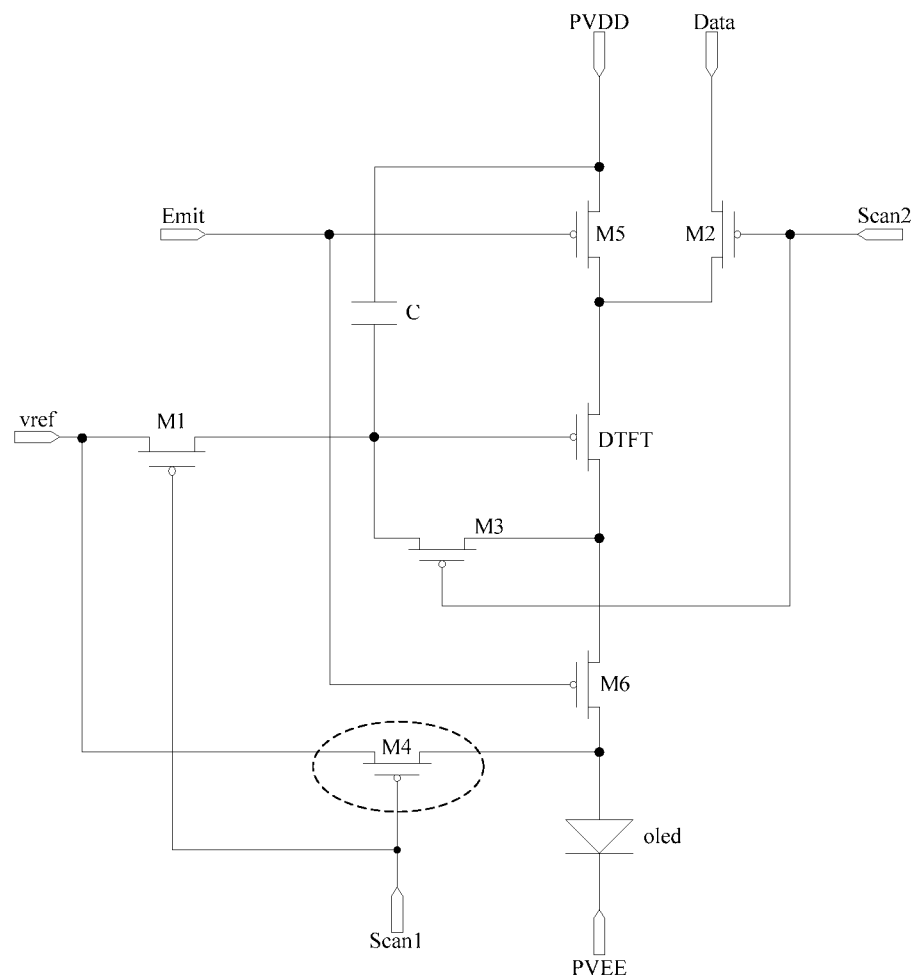
FIG. 6 shows a schematic structural diagram of a pixel circuit according to an embodiment of the disclosure.

In one or more embodiment, in the OLED display panel according to the embodiment of the disclosure, the pixel circuit further includes switch transistors with various functions in addition to the driving transistor DTFT, e.g., an anode reset transistor T2 illustrated in FIG. 5. The anode reset transistor T2 has an input terminal connected with the reference line vref, an output terminal connected with an anode layer of a light-emitting diode oled (i.e., the organic light-emitting pixel in the embodiment of the disclosure), and a gate connected with a scan line Scan. Before the light-emitting diode oled emits light, the anode reset transistor T2 is switched on, and the anode of the light-emitting diode oled is reset by a signal of the reference line vref, thus avoiding a signal remaining in the previous frame from affecting current in the light-emitting diode oled in the current frame. There are a number of particular structures of the pixel circuit, and as illustrated in FIG. 6, for example, the pixel circuit further includes six switch transistors M1 to M6, and a capacitor C in addition to the driving transistor DTFT where the switch transistor M4 is an anode reset transistor. FIG. 6 only illustrates the structure of the pixel circuit by way of an example, although the embodiment of the disclosure will not be limited thereto.

Figure 7:
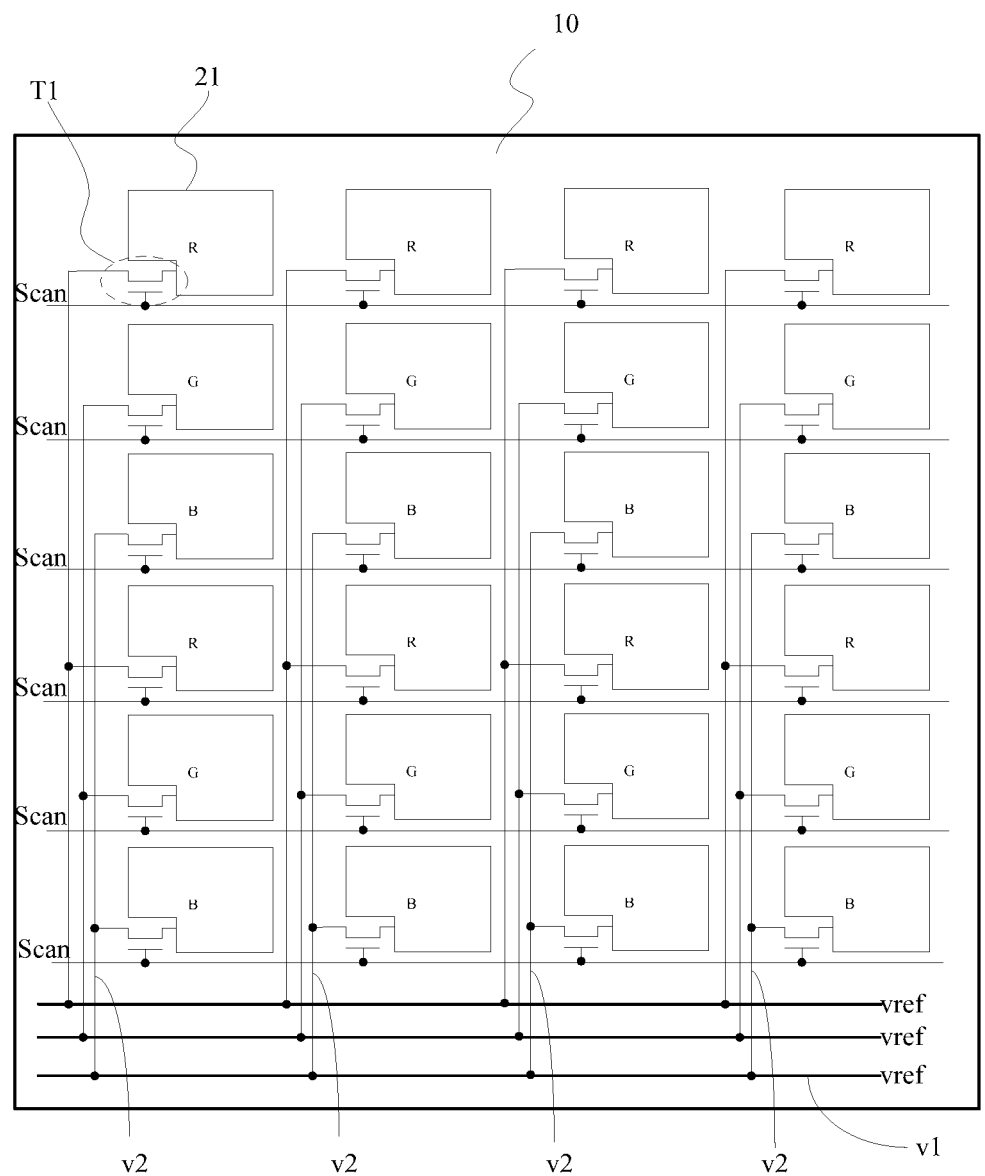
FIG. 7 shows a schematic structural diagram of a display panel according to another embodiment of the disclosure in a top view.

In one embodiment, in the display panel according to the embodiment of the disclosure, as illustrated in FIG. 7, the pixel circuits, each of which corresponds to each of the anode layers 21 (only the anode reset transistors in the pixel circuits, i.e., the first switch transistors T1, are illustrated in FIG. 7) are further arranged over the underlying substrate 10, and the first switch transistors T1 are also used as the anode reset transistors in the pixel circuits to provide the anode layers 21 with a reset signal while an image is being displayed.

In the display panel according to the embodiment of the disclosure, the reference lines connected with the first switch transistors are configured to provide the anode layers with a reset signal through the first switch transistors while an image is being displayed.

In the display panel according to the embodiment of the disclosure, the first switch transistors can also used as the anode reset transistors in the pixel circuits, and when the organic light-emitting functional layers are fabricated on the anode layers, electric charges are provided to the anode layers by the reference lines connected with the anode reset transistors, and when the display panel is displaying an image, the reference lines provide the anode layers with a reset signal through the first switch transistors. The anode reset transistors in the pixel circuits can reset the anode layers while an image is being displayed, and also can provide the anode layers with electric charges while the organic light-emitting functional layers are being fabricated, so the structure of the existing display panel will not be significantly modified except the reference lines are slightly modified as compared with the existing display panel. In the existing display panel. In the existing display panel, the reference lines connected with the respective anode reset transistors are connected with each other; while in the display panel according to the embodiment of the disclosure, at least the reference lines corresponding to the anode layers of the pixels in the different colors are disconnected from each other.

In the display panel according to the embodiment of the disclosure, as illustrated in FIG. 7, since the first switch transistors T1 can also used as the anode reset transistors in the pixel circuits, the gates of the first switch transistors T1 are generally connected with the scan lines Scan. When the organic light-emitting functional layers are fabricated on the anode layers 21, no signals will be provided to the scan lines Scan, but the first switch transistors T1 provide the anode layers 21 with electric charges using the leakage current. While the display panel is displaying an image, the first switch transistors T1 are controlled by a signal of the scan lines Scan to be switched on, a reset signal on the reference lines vref is transmitted to the anode layers 21 through the first switch transistors T1 which are switched on, to thereby reset the organic light-emitting pixels, i.e., the light-emitting diodes, here reference can be made to the mechanism of the existing display panel.

In one or more embodiment, in the display panel, a gate driver circuit is typically arranged in the non-display area on the left and right sides of the display area. Therefore, in the display panel according to the embodiment of the disclosure, the branches can extend in the column direction, and the buses can extend in the row direction, so that the buses can be arranged in an upper or lower edge frame of the display panel.

In the display panel according to the embodiment of the disclosure, as illustrated in FIG. 7, the scan lines Scan typically extend in the row direction, however, the scan lines Scan can alternatively extend in the column direction, although the embodiment of the disclosure will not be limited thereto.

In the display panel according to the embodiment of the disclosure, the signal lines extending in the same direction can be arranged at the same layer. If they are arranged at the same layer, then a mask process will be dispensed with to thereby lower a production cost. For example, in the display panel according to the embodiment of the disclosure, when the scan lines extend in the same direction as the buses, the scan lines can be arranged at the same layer as the buses; and when the scan lines extend in the same direction as the branches, the scan lines can be arranged at the same layer as the branches.

In one or more embodiment, the display panel according to the embodiment of the disclosure further includes data lines extending in the column direction, and when the branches also extend in the column direction, the data lines can be arranged at the same layer as the branches.

In one or more embodiment, the display panel according to the embodiment of the disclosure is typically manufactured by forming a plurality of display panels arranged in a matrix on a large mother substrate, and then cutting the mother substrate into the separate display panels in a cutting process.

Figure 8:
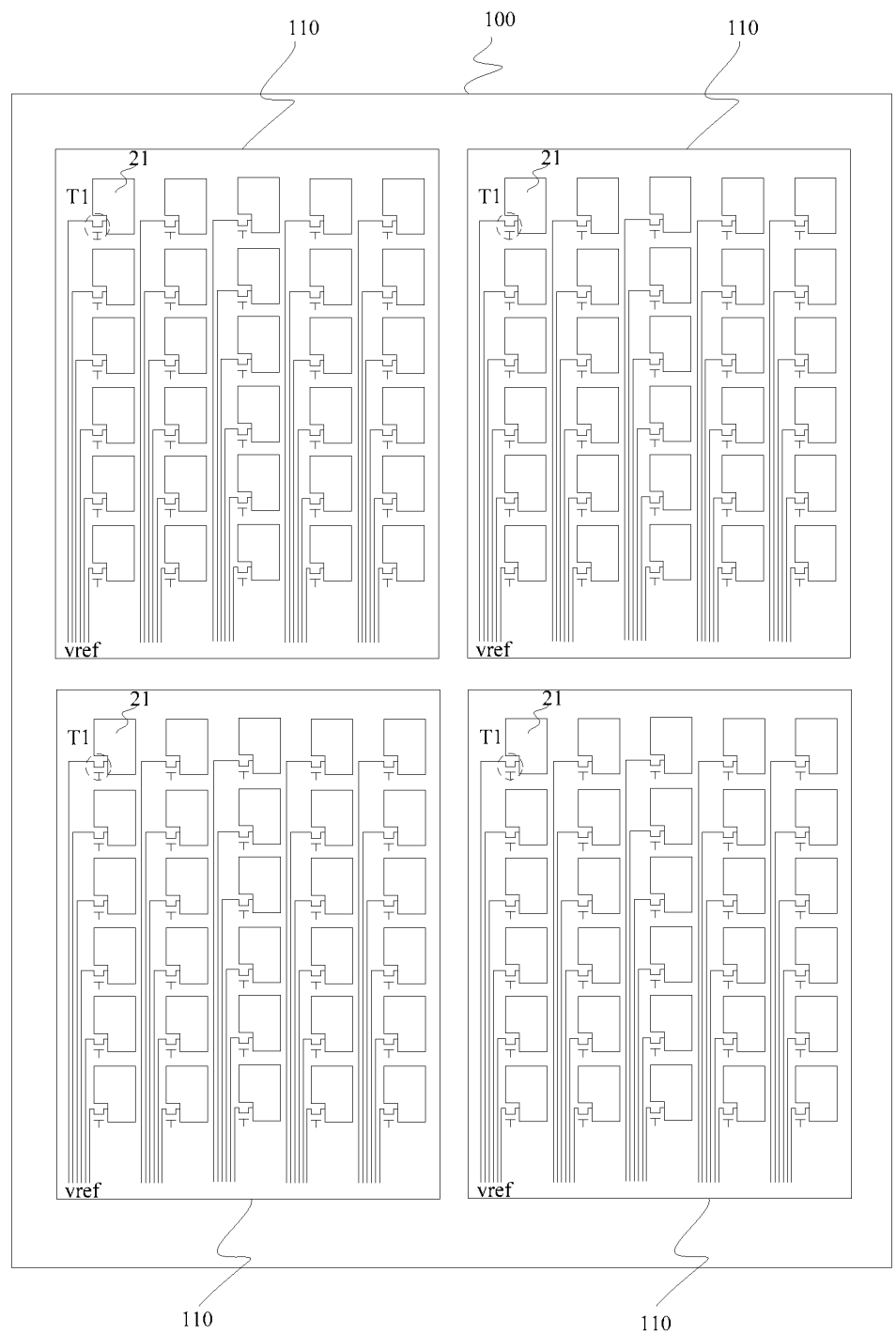
FIG. 8 shows a schematic structural diagram of a display substrate according to another embodiment of the disclosure in a top view.

Based upon the same inventive idea, an embodiment of the disclosure further provides a display substrate as illustrated in FIG. 8 including a mother substrate 100 including a plurality of display panel areas arranged in a matrix, and the display panel 110 according to any one of the embodiments above of the disclosure is arranged in each of the display panel areas. Since the display substrate addresses the problem under a similar principle to the display panel above, reference can be made to the implementation of the display panel above for an implementation of the display substrate, so a repeated description thereof will be omitted here.

Figure 9:
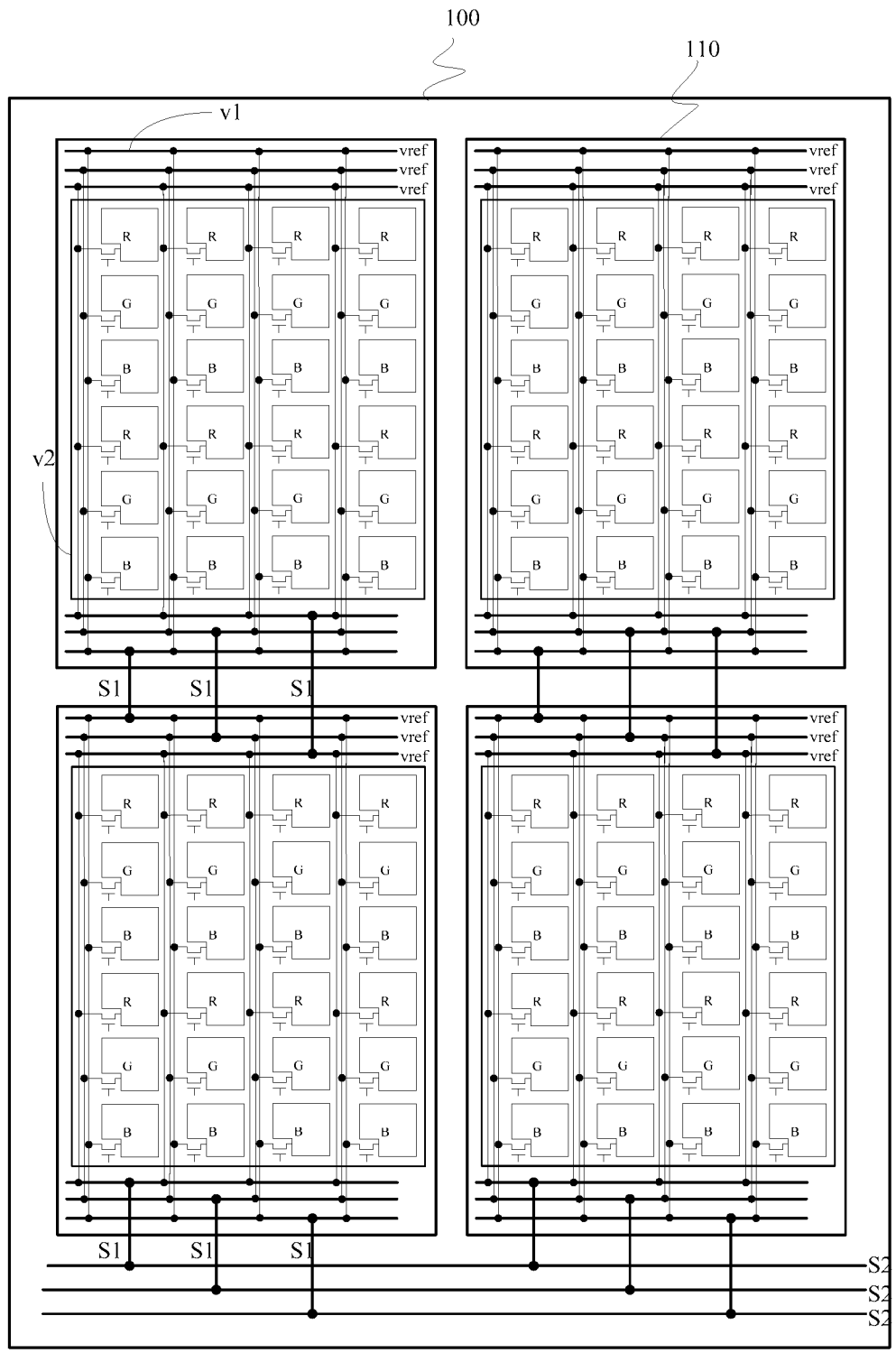
FIG. 9 shows a schematic structural diagram of a display substrate according to another embodiment of the disclosure in a top view.
Figure 10:
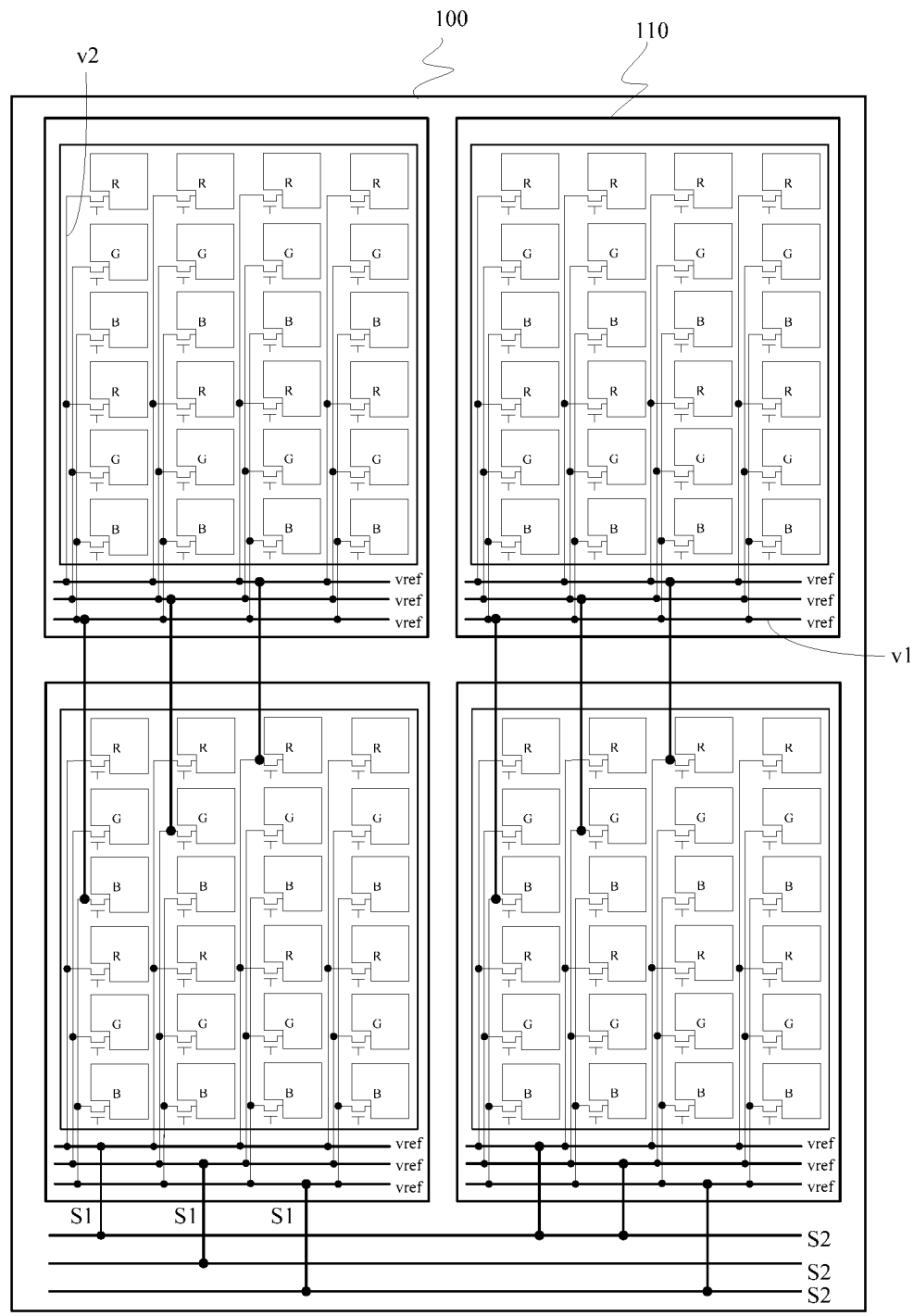
FIG. 10 shows a schematic structural diagram of a display substrate according to another embodiment of the disclosure in a top view.

In one embodiment, in the display substrate according to the embodiment of the disclosure, as illustrated in FIG. 9 and FIG. 10, the display substrate further includes connection lines S1 corresponding to the respective reference lines vref and bus bars S2; and the connection lines S1 are configured to connect all the reference lines vref corresponding to the anode layers 21 of the pixels in the same colors in the display panel with the same one of the bus bars S2, and the reference lines vref corresponding to the anode layers 21 of the pixels in the different colors are connected with different ones of the bus bars S2.

In one embodiment, in the display substrate according to the embodiment of the disclosure, as illustrated in FIG. 9 and FIG. 10, the reference lines vref include the buses v1 and the plurality of branches v2 connected with the respective buses v1. When the buses v1 extend in the first direction, and the plurality of branches v2 extend in the second direction as shown in FIG. 9 and FIG. 10, the connection lines S1 extend in the same direction as the branches v2, and the bus bars S2 extend in the same direction as the buses v1.

In one or embodiment, in the display substrate according to the embodiment of the disclosure, the connection lines are arranged at the same layer as the branches, and the bus bars are arranged at the same layer as the buses.

In one or embodiment, in the display substrate according to the embodiment of the disclosure, as illustrated in FIG. 9 and FIG. 10, the bus bars S2 are located outside the display panel areas of the mother substrate 100, so that the display panel can be avoided from being occupied by the bus bars S2.

In one embodiment, in the display substrate according to the embodiment of the disclosure, as illustrated in FIG. 9 and FIG. 10, the bus bars S2 are located proximate to the edge of the mother substrate 100, so that the width between the display panel areas can be avoided from being altered due to the bus bars S2 which would otherwise be arranged between the display panel areas.

In one or more embodiment, in the display substrate according to the embodiment of the disclosure, the bus bars S2 can alternatively be arranged between the display panel areas, although the embodiment of the disclosure will not be limited thereto.

In one embodiment, in the display substrate according to the embodiment of the disclosure, as illustrated in FIG. 9 and FIG. 10, the respective bus bars S2 are located on the same side of the mother substrate 100.

The bus bars are located on the same side of the mother substrate so that voltage can be applied to the bus bars. In one embodiments, in the display substrate according to the embodiment of the disclosure, alternatively a part of the bus bars can be located on one side of the mother substrate, and the other part of the bus bars can be located on the other side of the mother substrate, although the embodiment of the disclosure will not be limited thereto.

Based upon the same inventive idea, an embodiment of the disclosure further provides an inkjet printing method applicable to the display substrate above, where the method includes:

jetting and applying ink drops carrying electric charges onto anode layers of pixels in a preset color;

providing electric charges opposite in polarity to the electric charges carried in the ink drops to reference lines corresponding to the anode layers of the pixels in the preset color; and providing electric charges identical in polarity to the electric charges carried in the ink drops to reference lines corresponding to anode layers of pixels in the other colors than the preset pixel color;

where the preset pixel color is one of the pixel colors in the display panel areas.

Figure 11:
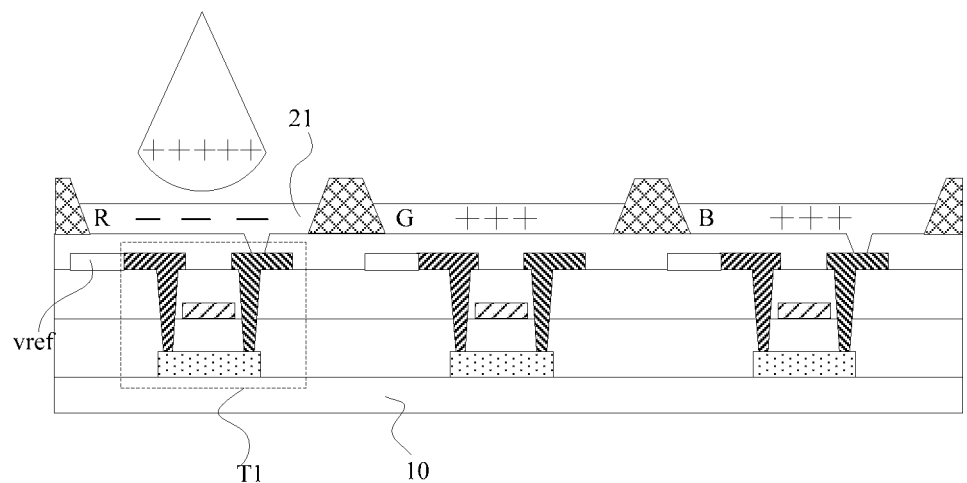
FIG. 11 is a schematic diagram illustrating an inkjet printing method according to an embodiment of the disclosure.

Particularly taking the red, green, and blue pixels as an example, as illustrated in FIG. 11, when ink drops carrying positive electric charges are jetted and applied onto an anode layer 21 of a red pixel, for example, negative electric charges are provided to a reference line corresponding to the anode layer 21 of the red pixel, so that the ink drops are attracted onto the anode layer 21 of the red pixel as per the principle that unlike charges attract. Alike positive electric charges are provided on reference lines corresponding to anode layers 21 of blue and green pixels, so that the anode layer 21 of the green pixel and the anode layer 21 of the blue pixel repel the ink drops carrying positive electric charges, as per the principle that like charges repel, thus addressing the problem in the related art of color crosstalk in a displayed image due to a positional offset of ink drops.

In the inkjet printing method according to the embodiment of the disclosure, when the pixels in the different colors correspond to different ink drops, the pixels are typically fabricated sequentially in an order of their colors. For example, firstly ink drops carrying electric charges are jetted and applied onto the anode layers of the red pixels, then ink drops carrying electric charges are jetted and applied onto the anode layers of the green pixels, and next ink drops carrying positive electric charges are jetted and applied onto the anode layers of the blue pixels, although the embodiment of the disclosure will not be limited to any particular order of the colors.

In one or more embodiment, the organic light-emitting functional layers formed on the anode layers generally include organic emitting layers corresponding to the respective colors of the pixels (that is, each pixel color corresponds to one of the organic emitting layers). The organic light-emitting functional layers also include common layers, e.g., at least one of a Hole Injection Layer (HIL), a Hole Transport Layer (HTL), an Electron Transport Layer (ETL), and an Electron Injection layer (EIL). When the organic emitting layers are formed, the inkjet printing method according to the embodiment of the disclosure can address the problem of color crosstalk in a displayed image due to a positional offset of ink drops. When the common layers in the organic light-emitting functional layers are formed, the inkjet printing method according to the embodiment of the disclosure will still be applicable even if there is no color crosstalk in a displayed image.

In one embodiment, the inkjet printing method according to the embodiment of the disclosure further includes: jetting and applying ink drops with electric charges onto all the anode layers, and providing all the reference lines with electric charges opposite in polarity to the electric charges carried in the ink drops. The ink drops can be distributed uniformly onto the anode layers as per the principle that unlike charges attract.

Figure 12:
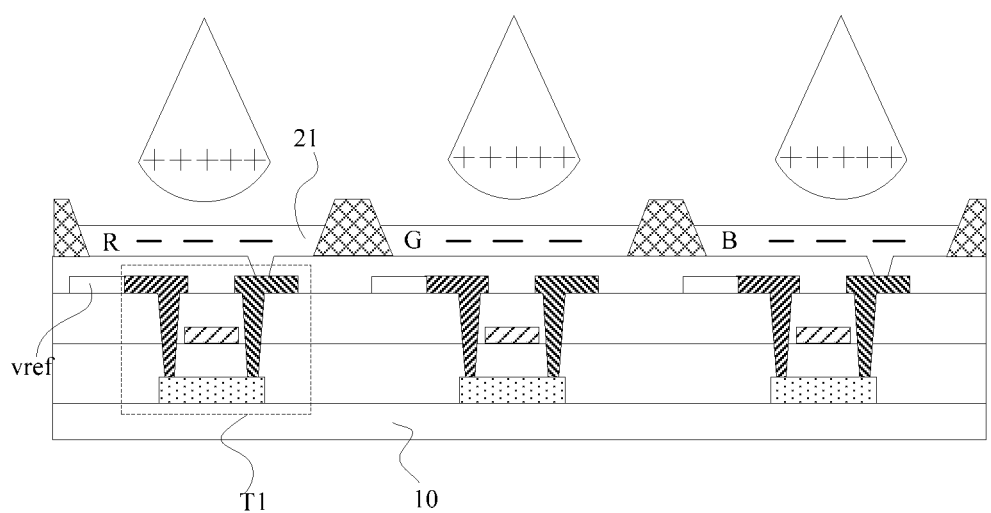
FIG. 12 is a schematic diagram illustrating an inkjet printing method according to another embodiment of the disclosure.

In one or more embodiment, taking the red, green, and blue pixels as an example, when the common layers are formed on the anode layers, as illustrated in FIG. 12, when ink drops carrying positive electric charges are jetted and applied onto the respective anode layers 21, for example, the respective reference lines vref are provided with negative electric charges, so that the ink drops can be distributed uniformly onto the anode layers 21 as per the principle that unlike charges attract.

In one embodiment, in the inkjet printing method according to the embodiment of the disclosure, when the display substrate includes the bus bars, the reference lines corresponding to the anode layers are provided with electric charges by applying voltage to the bus bars corresponding to the anode layers, so that the respective anode layers can be provided with electric charges simply by applying voltage to the bus bars, which are simple and easy to perform.

It shall be noted that in the inkjet printing method according to the embodiment of the disclosure, when the anode layers are provided with electric charges by the reference lines, the gates of the first switch transistors are floating, and the electric charges on the reference lines are transmitted to the anode layer using leakage current in the first switch transistors. In other embodiments, the first switch transistors can be controlled to be switched on, although this may be more difficult to implement.

In the display panel, the display substrate, and the inkjet printing method applicable to the display substrate according to the embodiments of the disclosure, the respective reference lines correspond to the respective anode layers, and the first switch transistors each of which corresponds to each of the respective anode layers are further arranged over the underlying substrate. Each of the respective anode layers is connected with its corresponding reference line through its corresponding first switch transistor. The anode layers of the pixels in the same color share the same reference line, and the anode layers of the pixels in different colors correspond to different reference lines, so that when ink drops are jetted and applied onto the anode layers through inkjet printing, electric charges are applied by the reference lines to the anode layers through the first switch transistor to make the anode layers opposite in polarity to electric charges carried in the ink drops from a corresponding nozzle, and thus the ink drops from the nozzle are attracted onto the anode layers of the pixels for which they are intended for, as per the principle that unlike charges attract so as to address the problem in the related art of color crosstalk in a displayed image due to a positional offset of ink drops.

The invention claimed is:

1. A display panel, comprising:
   an underlying substrate;
   anode layers of a plurality of organic light-emitting pixels arranged in a matrix over the underlying substrate;
   reference lines and first switch transistors, arranged over the underlying substrate; and
   each of the respective reference lines corresponds to each of the respective anode layers, respectively, and each of the first switch transistors corresponds to each of the anode layers, respectively; wherein:
   each of the anode layers is connected directly with the corresponding first switch transistor and connected with the corresponding reference line through the corresponding first switch transistor; and
   all anode layers of the pixels in a same color share a same reference line, and anode layers of the pixels in different colors correspond to different reference lines; and
   the reference lines provide the anode layers with electric charges in a process of fabricating organic light-emitting functional layers on the anode layers.

2. The display panel according to claim 1, wherein the display panel comprises pixels in at least three colors;
   reference lines corresponding to anode layers of the pixels in one of the colors comprise a bus extending in a first direction, and a plurality of branches, connected with the bus and extending in a second direction, wherein the first direction is perpendicular to the second direction;
   each of the branches corresponds to a column of anode layers of pixels in a same color, extending in the second direction; and
   each of the column of anode layers is connected with the corresponding branch through the corresponding first switch transistor.

3. The display panel according to claim 2, wherein the underlying substrate comprises a display area, and a non-display area surrounding the display area; and all of the anode layers, the first switch transistors, and the branches are located in the display area, and the buses are located in the non-display area.

4. The display panel according to claim 3, wherein the respective buses are located on a same side of the display area.

5. The display panel according to claim 3, wherein the reference lines corresponding to the anode layers of the pixels in one of the colors comprise two buses located respectively on two sides of the display area.

6. The display panel according to claim 1, further comprising pixel circuits arranged over the underlying substrate, each of the pixel circuits corresponds to each the anode layers, and the first switch transistors are used as anode reset transistors in the pixel circuits to provide the anode layers with a reset signal while an image is being displayed.

7. The display panel according to claim 6, wherein the reference lines connected with the first switch transistors are configured to provide the anode layers with the reset signal through the first switch transistors while an image is being displayed.

8. The display panel according to claim 1, wherein organic light-emitting functional layers are fabricated on the anode layers by jetting and applying ink drops carrying electric charges onto the anode layers through inkjet printing.

9. A display substrate, comprising:
a mother substrate comprising a plurality of display panel areas arranged in a matrix, wherein a display panel is arranged in each of the plurality of display panel areas, the display panel comprises:
an underlying substrate;
anode layers of a plurality of organic light-emitting pixels arranged in a matrix over the underlying substrate;
reference lines and first switch transistors, arranged over the underlying substrate; and
each of the respective reference lines correspond to each of the respective anode layers, respectively, and each of the first switch transistors correspond to each of the anode layers, respectively; wherein:
each of the anode layers is connected directly with the corresponding first switch transistor and connected with the corresponding reference line through the corresponding first switch transistor; and
all anode layers of the pixels in a same color share a same reference line, and anode layers of the pixels in different colors correspond to different reference lines; and the reference lines provide the anode layers with electric charges in a process of fabricating organic light-emitting functional layers on the anode layers.

10. The display substrate according to claim 9, wherein the display substrate further comprises connection lines and bus bars corresponding to the respective reference lines; and
the connection lines are configured to connect all reference lines corresponding to the anode layers of the pixels in a same color in the display panel with the same one of the bus bars, and reference lines corresponding to anode layers of the pixels in different colors are connected with different ones of the bus bars.

11. The display substrate according to claim 10, wherein when the reference lines comprise buses extending in a first direction, and a plurality of branches, connected with the respective buses, extending in a second direction:
the connection lines extend in a same direction as the branches; and
the bus bars extend in a same direction as the buses.

12. The display substrate according to claim 11, wherein the bus bars are located outside the display panel areas of the mother substrate.

13. The display substrate according to claim 12, wherein the bus bars are located proximate to edge of the mother substrate.

14. The display substrate according to claim 13, wherein the respective bus bars are located on a same side of the mother substrate.

15. An inkjet printing method applicable to the display substrate according to claim 9, wherein the method comprises:
jetting and applying ink drops carrying electric charges onto anode layers of pixels in a preset color, and providing electric charges opposite in polarity to the electric charges carried in the ink drops to reference lines corresponding to the anode layers of the pixels in the preset color; and providing electric charges identical in polarity to the electric charges carried in the ink drops to reference lines corresponding to anode layers of pixels in other colors than the preset pixel color, wherein:
the preset pixel color is one of the pixel colors in the display panel areas.

16. The inkjet printing method according to claim 15, wherein the display substrate comprises bus bars, and the reference lines corresponding to the anode layers are provided with electric charges by applying voltage to the bus bars corresponding to the anode layers.

17. The inkjet printing method according to claim 15, wherein the method further comprises: jetting and applying ink drops carrying electric charges onto all the anode layers, and providing all the reference lines with electric charges opposite in polarity to the electric charges carried in the ink drops.

* * * * *